(12) United States Patent
Sherman et al.

(10) Patent No.: US 8,890,044 B2
(45) Date of Patent: Nov. 18, 2014

(54) SOLAR CELL SYSTEM

(71) Applicant: Suncore Photovoltaics, Inc., Irwindale, CA (US)

(72) Inventors: James Sherman, Hillsborough, NJ (US); Igor Kozin, Princeton, NJ (US)

(73) Assignee: Suncore Photovoltaics, Incorporated, Albuquerque, NM (US)

(*) Notice: Subject to any disclaimer, the term of this patent is extended or adjusted under 35 U.S.C. 154(b) by 0 days.

(21) Appl. No.: 13/946,793

(22) Filed: Jul. 19, 2013

(65) Prior Publication Data
US 2013/0306836 A1 Nov. 21, 2013

Related U.S. Application Data

(63) Continuation of application No. 12/619,322, filed on Nov. 16, 2009, now Pat. No. 8,507,837, which is a continuation-in-part of application No. 12/468,747, filed on May 19, 2009, now Pat. No. 8,193,477, and a continuation-in-part of application No. 12/258,253, filed on Oct. 24, 2008, now Pat. No. 7,795,568, and a continuation-in-part of application No. 12/498,135, filed on Jul. 6, 2009, now Pat. No. 8,513,514, which is a continuation-in-part of application No. 12/258,253, filed on Oct. 24, 2008, now Pat. No. 7,795,568.

(51) Int. Cl.
| | |
|---|---|
| *G01C 21/02* | (2006.01) |
| *H01L 31/042* | (2014.01) |
| *G01S 3/786* | (2006.01) |
| *F24J 2/38* | (2014.01) |
| *F24J 2/46* | (2006.01) |
| *F24J 2/54* | (2006.01) |
| *G01S 3/781* | (2006.01) |

(52) U.S. Cl.
CPC ............... *G01S 3/7861* (2013.01); *F24J 2/38* (2013.01); *F24J 2/4607* (2013.01); *F24J 2/542* (2013.01); *G01S 3/781* (2013.01); *H01L 31/0422* (2013.01); *F24J 2200/04* (2013.01); *Y02E 10/47* (2013.01); *Y02E 10/50* (2013.01)
USPC ........................................ 250/203.4; 136/246

(58) Field of Classification Search
USPC ................. 250/203.1, 203.4, 203.5; 136/246; 126/600–603
See application file for complete search history.

(56) References Cited

U.S. PATENT DOCUMENTS

| | | | |
|---|---|---|---|
| 3,966,499 A | 6/1976 | Yasui et al. | |
| 4,001,864 A | 1/1977 | Gibbons | |

(Continued)

FOREIGN PATENT DOCUMENTS

| | | |
|---|---|---|
| AU | 2087695 | 10/1995 |
| CN | 2882108 Y | 3/2007 |

(Continued)

OTHER PUBLICATIONS

U.S. Appl. No. 13/970,235, filed Aug. 19, 2013, Sherman.

(Continued)

*Primary Examiner* — Thanh Luu
(74) *Attorney, Agent, or Firm* — Mueting, Raasch & Gebhardt, P.A.

(57) ABSTRACT

An automated method to monitor performance of a terrestrial solar cell array tracking the sun. The solar cell system includes drive means that adjust a position of the array along different respective axes with respect to the sun using the drive means. The techniques include predicting the position of the sun during a time period, and sampling an output parameter of the array indicative of performance. The sampled data may be used to identify a fault in the solar cell array, for example a misalignment or a failure of one or more solar cells, in which case a notification of that fault may be generated for the operator or a control signal may be output for correcting the fault. Alternatively, an output signal may be sent to an external system associated with the solar cell system. Various alignment testing routines for checking the solar tracking are described. These routines may involve moving a solar cell array to a reference position at the start of, or during, an alignment routine in order to improve accuracy of position measurement during the routine.

15 Claims, 9 Drawing Sheets

(56) References Cited

U.S. PATENT DOCUMENTS

| | | | |
|---|---|---|---|
| 4,031,385 A | 6/1977 | Zerlaut et al. | |
| 4,109,640 A | 8/1978 | Smith | |
| 4,172,739 A | 10/1979 | Tassen | |
| 4,187,123 A | 2/1980 | Diggs | |
| 4,249,514 A | 2/1981 | Jones | |
| 4,338,480 A | 7/1982 | Antypas et al. | |
| 4,345,582 A | 8/1982 | Aharon | |
| 4,385,198 A | 5/1983 | Rahilly | |
| 4,425,904 A | 1/1984 | Butler | |
| 4,491,681 A | 1/1985 | Kirpich | |
| 4,574,659 A | 3/1986 | Arndt | |
| 4,585,318 A | 4/1986 | Seifert | |
| 4,759,803 A | 7/1988 | Cohen | |
| 4,832,001 A | 5/1989 | Baer | |
| 4,868,379 A | 9/1989 | West | |
| 4,933,022 A | 6/1990 | Swanson | |
| 4,989,124 A | 1/1991 | Shappell | |
| 4,995,377 A * | 2/1991 | Eiden | 126/605 |
| 5,009,720 A | 4/1991 | Hokuyo et al. | |
| 5,019,177 A | 5/1991 | Wanlass | |
| 5,022,929 A | 6/1991 | Gallois-Montbrun | |
| 5,053,083 A | 10/1991 | Sinton | |
| 5,118,361 A | 6/1992 | Fraas et al. | |
| 5,169,456 A | 12/1992 | Johnson | |
| 5,217,539 A | 6/1993 | Fraas et al. | |
| 5,228,924 A | 7/1993 | Barker et al. | |
| 5,248,346 A | 9/1993 | Fraas et al. | |
| 5,317,145 A | 5/1994 | Corio | |
| 5,322,572 A | 6/1994 | Wanlass | |
| 5,330,583 A | 7/1994 | Asai et al. | |
| 5,342,453 A | 8/1994 | Olson | |
| 5,376,185 A | 12/1994 | Wanlass | |
| 5,389,158 A | 2/1995 | Fraas et al. | |
| 5,389,159 A | 2/1995 | Kataoka et al. | |
| 5,405,453 A | 4/1995 | Ho et al. | |
| 5,600,124 A | 2/1997 | Berger | |
| 5,616,185 A | 4/1997 | Kukulka | |
| 5,622,078 A | 4/1997 | Mattson | |
| 5,632,823 A | 5/1997 | Sharan | |
| 5,798,517 A | 8/1998 | Berger | |
| 5,944,913 A | 8/1999 | Hou et al. | |
| 6,051,776 A | 4/2000 | Kimata et al. | |
| 6,058,930 A | 5/2000 | Shingleton | |
| 6,080,927 A | 6/2000 | Johnson | |
| 6,103,970 A | 8/2000 | Kilmer et al. | |
| 6,123,067 A * | 9/2000 | Warrick | 126/593 |
| 6,239,354 B1 | 5/2001 | Wanlass | |
| 6,252,287 B1 | 6/2001 | Kurtz et al. | |
| 6,278,054 B1 | 8/2001 | Ho et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,316,716 B1 | 11/2001 | Hilgrath | |
| 6,326,540 B1 | 12/2001 | Kilmer et al. | |
| 6,340,788 B1 | 1/2002 | King et al. | |
| 6,359,210 B2 | 3/2002 | Ho et al. | |
| 6,372,980 B1 | 4/2002 | Freundlich | |
| 6,399,874 B1 | 6/2002 | Olah | |
| 6,452,086 B1 | 9/2002 | Muller | |
| 6,465,725 B1 | 10/2002 | Shibata et al. | |
| 6,482,672 B1 | 11/2002 | Hoffman et al. | |
| 6,483,093 B1 | 11/2002 | Takemura et al. | |
| 6,552,257 B1 | 4/2003 | Hart et al. | |
| 6,563,040 B2 | 5/2003 | Hayden et al. | |
| 6,600,100 B2 | 7/2003 | Ho et al. | |
| 6,660,928 B1 | 12/2003 | Patton et al. | |
| 6,680,432 B2 | 1/2004 | Sharps et al. | |
| 6,696,637 B2 | 2/2004 | Lawheed | |
| 6,951,819 B2 | 10/2005 | Iles et al. | |
| 6,960,717 B2 | 11/2005 | Stuart et al. | |
| 7,071,407 B2 | 7/2006 | Fatemi et al. | |
| 7,109,461 B2 * | 9/2006 | Lasich | 250/203.4 |
| 7,252,084 B2 | 8/2007 | Pawlenko et al. | |
| 7,381,886 B1 | 6/2008 | Aiken et al. | |
| 7,476,832 B2 * | 1/2009 | Vendig et al. | 250/203.4 |
| 7,795,568 B2 | 9/2010 | Sherman | |
| 8,188,415 B2 * | 5/2012 | Kats et al. | 250/203.4 |
| 8,193,477 B2 | 6/2012 | Sherman et al. | |
| 8,466,399 B1 | 6/2013 | Sherman | |
| 8,578,929 B2 * | 11/2013 | Krabbe et al. | 126/605 |
| 8,592,738 B1 | 11/2013 | Kozin et al. | |
| 2002/0040727 A1 | 4/2002 | Stan et al. | |
| 2002/0164834 A1 | 11/2002 | Boutros et al. | |
| 2003/0000564 A1 | 1/2003 | Singleton et al. | |
| 2003/0066555 A1 | 4/2003 | Hui et al. | |
| 2003/0070707 A1 | 4/2003 | King et al. | |
| 2003/0075215 A1 | 4/2003 | Sharps et al. | |
| 2003/0140962 A1 | 7/2003 | Sharps et al. | |
| 2003/0145884 A1 | 8/2003 | King et al. | |
| 2004/0031517 A1 | 2/2004 | Bareis | |
| 2004/0045598 A1 | 3/2004 | Narayanan et al. | |
| 2004/0112373 A1 | 6/2004 | Djeu | |
| 2004/0112424 A1 | 6/2004 | Araki et al. | |
| 2004/0149331 A1 | 8/2004 | Sharps et al. | |
| 2005/0121071 A1 | 6/2005 | Repetto et al. | |
| 2005/0274409 A1 | 12/2005 | Fetzer | |
| 2005/0284467 A1 | 12/2005 | Patterson | |
| 2006/0054162 A1 | 3/2006 | Romeo | |
| 2006/0144435 A1 | 7/2006 | Wanlass | |
| 2006/0162768 A1 | 7/2006 | Wanlass | |
| 2007/0079863 A1 | 4/2007 | Stan et al. | |
| 2007/0089777 A1 | 4/2007 | Johnson, Jr. et al. | |
| 2007/0101738 A1 | 5/2007 | Akei et al. | |
| 2007/0188876 A1 | 8/2007 | Hines et al. | |
| 2007/0193620 A1 | 8/2007 | Hines et al. | |
| 2007/0215199 A1 | 9/2007 | Dold et al. | |
| 2007/0246095 A1 | 10/2007 | Schaefer | |
| 2008/0041440 A1 * | 2/2008 | O'Connell et al. | 136/246 |
| 2008/0128536 A1 | 6/2008 | Johnson et al. | |
| 2008/0135087 A1 | 6/2008 | Anikara | |
| 2008/0178867 A1 | 7/2008 | DiDomenico | |
| 2008/0258051 A1 | 10/2008 | Heredia et al. | |
| 2008/0290252 A1 | 11/2008 | Leonhardt et al. | |
| 2009/0000662 A1 | 1/2009 | Harwood et al. | |
| 2009/0032014 A1 | 2/2009 | Meydbray | |
| 2009/0032084 A1 | 2/2009 | Aiken et al. | |
| 2009/0032086 A1 | 2/2009 | Kats et al. | |
| 2009/0126774 A1 * | 5/2009 | Taylor et al. | 136/244 |
| 2009/0179139 A1 | 7/2009 | Hines et al. | |
| 2009/0188488 A1 * | 7/2009 | Kraft et al. | 126/601 |
| 2010/0011565 A1 | 1/2010 | Zawadzki et al. | |
| 2010/0018519 A1 | 1/2010 | McDonald et al. | |
| 2010/0018570 A1 | 1/2010 | Cashion et al. | |
| 2010/0023138 A1 | 1/2010 | McDonald et al. | |
| 2010/0032004 A1 | 2/2010 | Baker et al. | |
| 2010/0101625 A1 | 4/2010 | Kats et al. | |
| 2010/0101630 A1 | 4/2010 | Kats et al. | |
| 2010/0101632 A1 | 4/2010 | Kats et al. | |
| 2010/0102200 A1 | 4/2010 | Kats et al. | |
| 2010/0102201 A1 | 4/2010 | Sherman | |
| 2010/0102202 A1 | 4/2010 | Sherman | |
| 2010/0108860 A1 | 5/2010 | Sherman et al. | |
| 2010/0175741 A1 * | 7/2010 | Thorne | 136/251 |
| 2010/0294337 A1 | 11/2010 | Sherman et al. | |
| 2011/0289750 A1 | 12/2011 | Kats et al. | |

FOREIGN PATENT DOCUMENTS

| | | |
|---|---|---|
| CN | 1949525 A | 4/2007 |
| DE | 30 05 876 | 9/1981 |
| DE | 3236506 | 3/1984 |
| DE | 103 43 374 | 12/2004 |
| DE | 20 2005 002 411 | 5/2005 |
| DE | 10 2005 055 258 | 5/2007 |
| EP | 0024057 | 2/1981 |
| EP | 0369666 | 7/1989 |
| EP | 0464738 | 1/1992 |
| EP | 0537781 | 4/1993 |
| EP | 0789405 | 8/1997 |
| EP | 1126529 | 8/2001 |
| EP | 1691423 | 8/2006 |
| EP | 1788322 | 5/2007 |
| ES | 1044310 | 4/2000 |
| ES | 2253099 | 5/2006 |

(56) References Cited

FOREIGN PATENT DOCUMENTS

| | | |
|---|---|---|
| FR | 2566183 | 12/1985 |
| GB | 2128017 | 4/1984 |
| GB | 2346010 | 7/2000 |
| JP | 60-160181 | 8/1985 |
| JP | 9064397 | 3/1997 |
| JP | 10062017 | 3/1998 |
| JP | 2000-196127 | 7/2000 |
| JP | 2000-223730 | 8/2000 |
| JP | 2002-202817 | 7/2002 |
| JP | 2004-153202 | 5/2004 |
| WO | WO 96/18213 | 6/1996 |
| WO | WO 99/62125 | 12/1999 |
| WO | WO 02/079793 | 10/2002 |
| WO | WO 02/080286 | 10/2002 |
| WO | WO 2008/008023 | 1/2008 |
| WO | WO 2009/048879 | 4/2009 |

OTHER PUBLICATIONS

"170 Watt Multi-Purpose Module NEC 2008 Compliant, NE-170UC1" datasheet. Sharp Electronics Corporation, Huntington, CA, 2008; 2 pgs.

"Combined Search and Examination Report," application No. GB0918669.3. Feb. 17, 2010. Intellectual Property Office, Newport, South Wales, UK.

"Concentrating PV module and system developers[#5]" PHOTON International: The Photovoltaic Magazine, Photon Europe GmbH, Germany, Aug. 2009; pp. 134-137.

Cotal et al. "Outdoor Operation of GaInP/GaAs/Ge Triple Junction Concentrator Solar Cells Up to 1000 Suns;" 3rd World Conference on Photovoltaic Energy Conversion, May 11-18, 2003 Osaka, Japan; 3 pages.

"FEiNA SF-4 Mini Tracker" datasheet. OPEL Solar™ Inc., www.opelinc.com, Shelton, CT, Nov. 2009; 2 pgs.

"FEiNA SF-9 Dual Axis Tracker" datasheet. OPEL Solar™ Inc., www.opelinc.com, Shelton, CT, Nov. 2009; 2 pgs.

"FEiNA SF-20 Dual Axis Tracker" datasheet. OPEL Solar™ Inc., www.opelinc.com, Shelton, CT, Nov. 2009; 2 pgs.

Fraas et al., "Start-Up of First 100 kW System in Shanghai with 3-Sun PV Mirror Modules." Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA. 4 pages.

Fraas et al., "Test Sites and Testing of 3-Sun Mirror Modules." Presented at IEEE 4th World Conference on Photovoltaic Energy Conversion, Waikoloa, Hawaii, May 9, 2006. Jxcrystals.com. JX Crystals, Inc., Issaquah, WA. 4 pages.

Garboushian et al. "A Novel High-Concentration PV Technology for Cost Competitive Utility Bulk Power Generations;" Proc. 1st World Conference on Photovoltaic Energy Conversion, Waikoloa, Hawaii, Dec. 5-9, 1994; 4 pgs.

German Examination Report 10 2007 044 477. 1-33, dated Oct. 24, 2008; 5 pgs.

"GLOBO-welding. Laser welding of plastics—innovative and flexible. The universal processing concept for 3D and continuous applications." Brochure datasheet. http://www.leister.com/uploads/pdf/en/BRO_GLOBO_Welding_dv092006_ENG.pdf. Sep. 2006. Leister Process Technologies. Sarnen, Switzerland. 4 pages.

Hering, "Starthilfe fur einen Hoffnungsträger," dated May 2007; pp. 96-103.

"Kinematics slewing drives," Product description datasheet [online]. Kinematics Manufacturing, Inc., Phoenix, AZ, 2009, available online [retrieved on Jul. 8, 2009]. Retrieved from the Internet:<URL: www.kinematicsmfg.com/Products/slewing-drives.aspx>; 1 page.

King et al. "High-efficiency space and terrestrial multijunction solar cells through bandgap control in cell structures." 2002 Photovoltaic Specialists Conference, Conference Record of the 29th IEEE, May 19-24, 2002, pp. 776-781. New Orleans, LA.

"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).

Levy et al., "Photovoltaic Concentrator Module Improvements Study" Contractor Report, Sandia National Laboratories; SAND91-7001 Unlimited Release UC-275 http://www.osti.gov/bridge/serlets/purl/5212150-HmCMF1/5212150.PDF; Aug. 1991; 156 pgs.

Luque et al., Ed. Sections 9.8 and 9.9 "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, Jul. 7, 2003; 64 pgs.

"Mk-ID High Concentration Photovoltaic Panel (HCPV)" datasheet. OPEL Solar™ Inc., www.opelinc.com, Shelton, CT, Nov. 2009; 2 pgs.

Newman et al, "Terrestrial Solar Cell Development at Emcore and Roadmap to achieving Higher Performance," 4th International Conference on Solar Concentrators for the Generation of Electricity or Hydrogen, Mar. 12-16, 2007, San Lorenzo de El Escorial, Spain, 4 pgs.

Office Action, State Intellectual Property Office, China, application No. 200710163494.5. With attached English translation. May 4, 2010; 9 pgs.

Office Action mailed Mar. 29, 2011. U.S. Appl. No. 12/200,168.

"OPEL SF-4M Roof Top Tracker" datasheet. OPEL Solar™ Inc., www.opelinc.com, Shelton, CT, Nov. 2009; 2 pgs.

"OPEL SF-20 CPV Dual Axis Tracker" datasheet. OPEL Solar™ Inc., www.opelinc.com, Shelton, CT, Nov. 2009; 2 pgs.

"OPEL TF-800 Single Axis Tracker" datasheet. OPEL Solar™ Inc., www.opelinc.com, Shelton, CT, Nov. 2009; 2 pgs.

Peters et al., "Manufacturing Injection-Molded Fresnel Lens Parquets for Point-Focus Concentrating Photovoltaic Systems" Contractor Report, Sandia National Laboratories; SAND95-1554 Unlimited Release UC-1272 http://www.osti.gov/bridge/servlets/purl/120927-64DD1o/webviewable/120927.PDF; Oct. 1995; 34 pgs.

Photograph of GE Concentrator Array, Circa 1983, Sandia; 1 page.

"Power-Spar PS-140 Solar Concentrator," datasheet. Menova Energy, Inc., Markham, Ontario, Canada, 2009 (metadata indicates that the datasheet was created Jan. 19, 2009); 2 pgs.

"SF-40 H1 Rooftop Tracker" datasheet. OPEL Solar™ Inc., www.opelinc.com, Shelton, CT, Nov. 2009; 2 pgs.

Sherif et al., "First demonstration of multi junction receivers in a grid-connected concentrator module," Conference Record of the Thirty-First IEEE Photovoltaic Specialist Conference, Lake Buena Vista, FL, Jan. 3-7, 2005; pp. 635-638.

Slade et al. "High Efficiency Solar Cells for Concentrator Systems: Silicon or Multi-Junction?" SPIE Optics and Photonics, San Diego, CA, Aug. 2005; 8 pgs.

"Shop Sabre, a N.A.S.C.I. Company, 'The Way CNC Was Meant to Be'" Laser Product Information datasheet. Shop SABRE, Elko, MN, USA, 2007, available online [earliest known availability: Jun. 13, 2007; retrieved on Jun. 26, 2008]. Retrieved from the Internet:<URL:http://www.shopsabre.com/Laser%20Page.html>; 4 pgs.

"Slewing Drives S7b-73m-32ra," datasheet [online]. Kinematics Manufacturing, Inc., Phoenix, AZ, 2009, available online [earliest known Mar. 8, 2009; retrieved on Jul. 8, 2009]. Retrieved from the Internet:<URL:www.kinematicsmfg.com/Products/slewing-drives/SlewingDrivesProducts/Slewing-Drives-S7B-73M-32RA.aspx>; 2 pgs.

"State of the Art Report," Spanish application No. 200703074. Spanish Patent and Trademark Office, Madrid, Spain. May 19, 2010. With attached English translation of comments on relevant documents cited. 6 pgs.

Stone et al., "Design & Performance of the Amonix High Concentration Solar PV System," ASES/ASME National Solar Energy Conference, Reno, NV, Jun. 15-20, 2002, 7 pgs.

Stone et al., "Operation of 350 kW of Amonix High Concentration PV Systems at Arizona Public Service," ASME 2003 International Solar Energy Conference, Kohala Coast, Hawaii, Mar. 15-18, 2003, 6 pgs.

Stone et al. "Analysis of Five Years of Field Performance of the Amonix High Concentration PV System." Powergen 2006, Las Vegas, NV, Apr. 2006, 12 pgs.

(56) References Cited

OTHER PUBLICATIONS

"SunCube™ Specifications" datasheet. Green & Gold Energy Pty, Ltd., Glynde, South Australia, Australia, Sep. 3, 2009; 4 pgs.

"Sunflower" datasheet. Energy Innovations, Poway, CA, copyright 2003-2010; 2 pgs.

Takamoto et al., "InGaP/GaAs-based multijunction solar cells," Prog Photovoltaics Res Appl; Sep. 2005; 13(6):495-511.

"TF-500 Dual Axis Tracker" datasheet. OPEL Solar™ Inc., www.opelinc.com, Shelton, CT, Nov. 2009; 2 pgs.

White et al., "Solar Kinetics' Photovoltaic Concentrator Module and Tracker Development" Contractor Report, Sandia National Laboratories; SAND95-2528 Unlimited Release UC-1272. Nov. 1995. http://www.osti.gov/bridge/servlets/purl/159347-62QrpU/webviewable/159347.PDF.

"WS T1000" datasheet [online]. WS Energia Lda, Oeiras, Portugal, earliest known availability Oct. 20, 2010, available online. Retrieved from the Internet<URL: http://www.ws-energia.com/np4EN/trackers>; 2 pgs.

"WS T 1600—the world wide connected solar tracker" datasheet [online] WS Energia Lda, Oeiras, Portugal, earliest known availability Oct. 20, 2010, available online. Retrieved from the Internet:<URL: http://www.ws-energia.com/np4EN/trackers>; 3 pgs.

"WS T 1600—the world wide connected solar tracker" datasheet [online] WS Energia Lda, Oeiras, Portugal, earliest known availability Oct. 20, 2010, available online. Retrieved from the Internet:<URL: http://www.ws-energia.com/np4EN/trackers>; 2 pgs.

* cited by examiner

SOLAR CELL SYSTEM

CROSS-REFERENCE TO RELATED APPLICATIONS

This application is a continuation of U.S. patent application Ser. No. 12/619,322 filed on Nov. 16, 2009, which is a continuation in part of: U.S. patent application Ser. No. 12/498,135 filed on Jul. 6, 2009, which is a continuation in part of U.S. patent application Ser. No. 12/258,253 filed on Oct. 24, 2008; U.S. patent application Ser. No. 12/468,747 filed on May 19, 2009; and U.S. patent application Ser. No. 12/258,253 filed on Oct. 24, 2008, the disclosures of each of which are hereby expressly incorporated herein by reference.

TECHNICAL FIELD

This disclosure relates to solar tracking for terrestrial solar cell arrays and more particularly to techniques for monitoring performance metrics of the array during solar tracking, and adjusting the motion of the array so that it is more accurately aligned with the sun.

BACKGROUND

In solar tracking systems, generally one or more terrestrial solar cell arrays track the motion of the sun and convert sunlight into electrical energy. Accurate solar tracking is necessary because the amount of power generated by a given solar cell is related to the amount of sunlight that impinges on that solar cell. This is a particular concern for a concentrating solar cell array which uses lenses to focus sunlight onto respective solar cells because a tracking misalignment of only a few degrees can significantly reduce the amount of sunlight impinging on the solar cells and hence the power output of the solar cells. Solar tracking is achieved by properly orientating the array relative to the sun at an initial time instant and then using motors and actuators to move the array (e.g., in roll and pitch or in azimuth and elevation directions) along a predetermined path that properly tracks movement of the sun. However, from time to time deviations may still occur from accurate alignment of the solar array with the sun.

DETAILED DESCRIPTION

Figure 1:
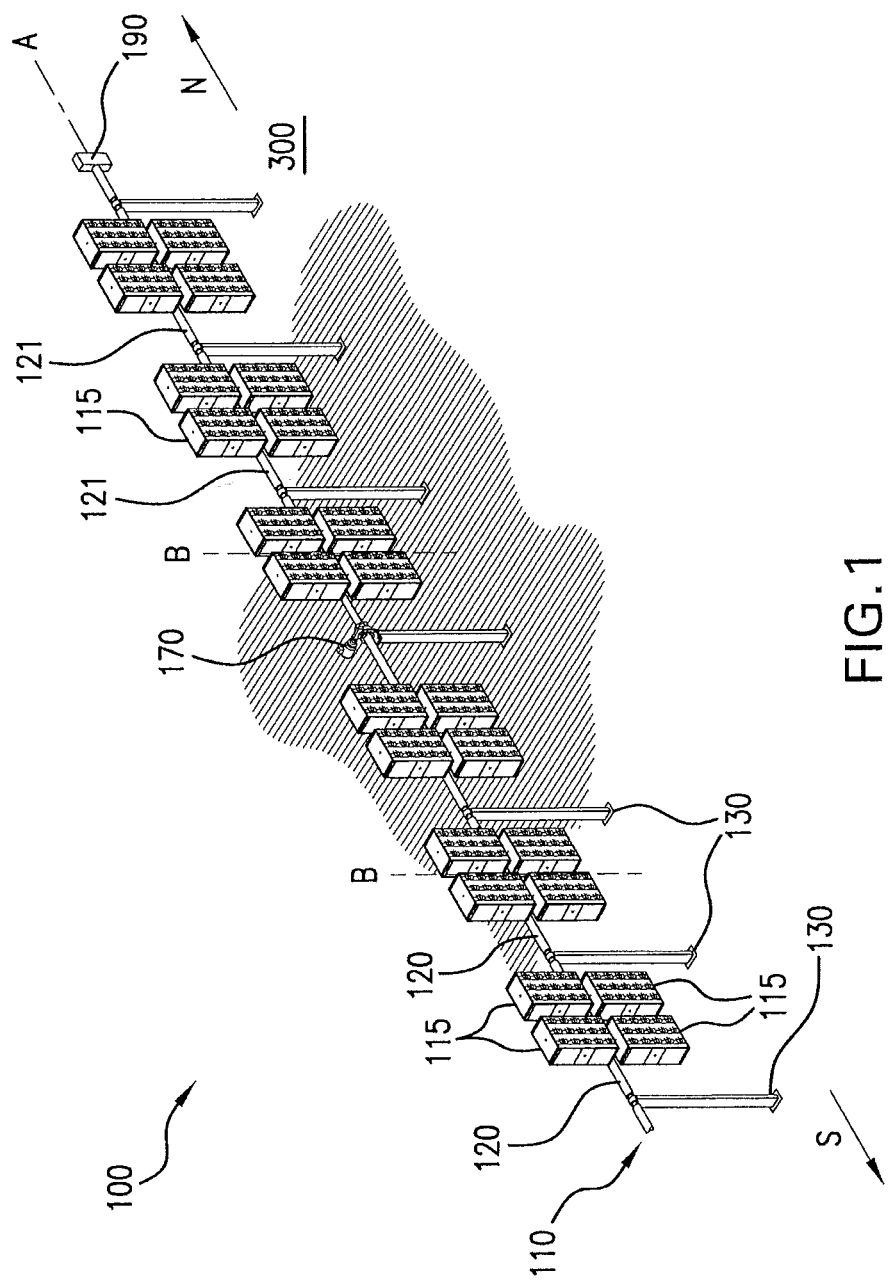
FIG. 1 illustrates a row of solar cell arrays which track the position of the sun during the day.
Figure 2:
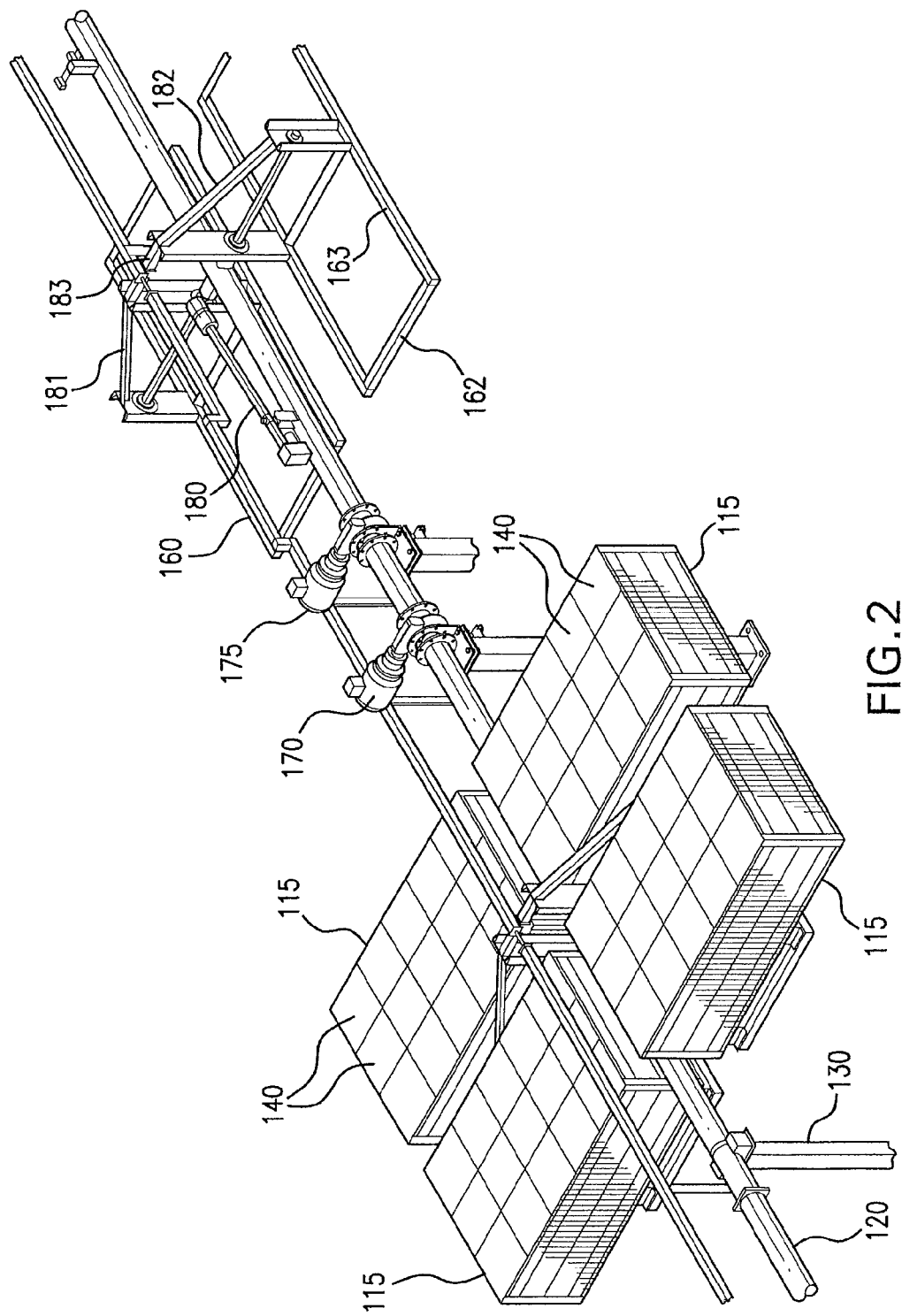
FIG. 2 illustrates a portion of the row of solar cell arrays from FIG. 1, illustrating motor controls for adjusting a roll position and a pitch position of the solar cell arrays of the row.
Figure 3:
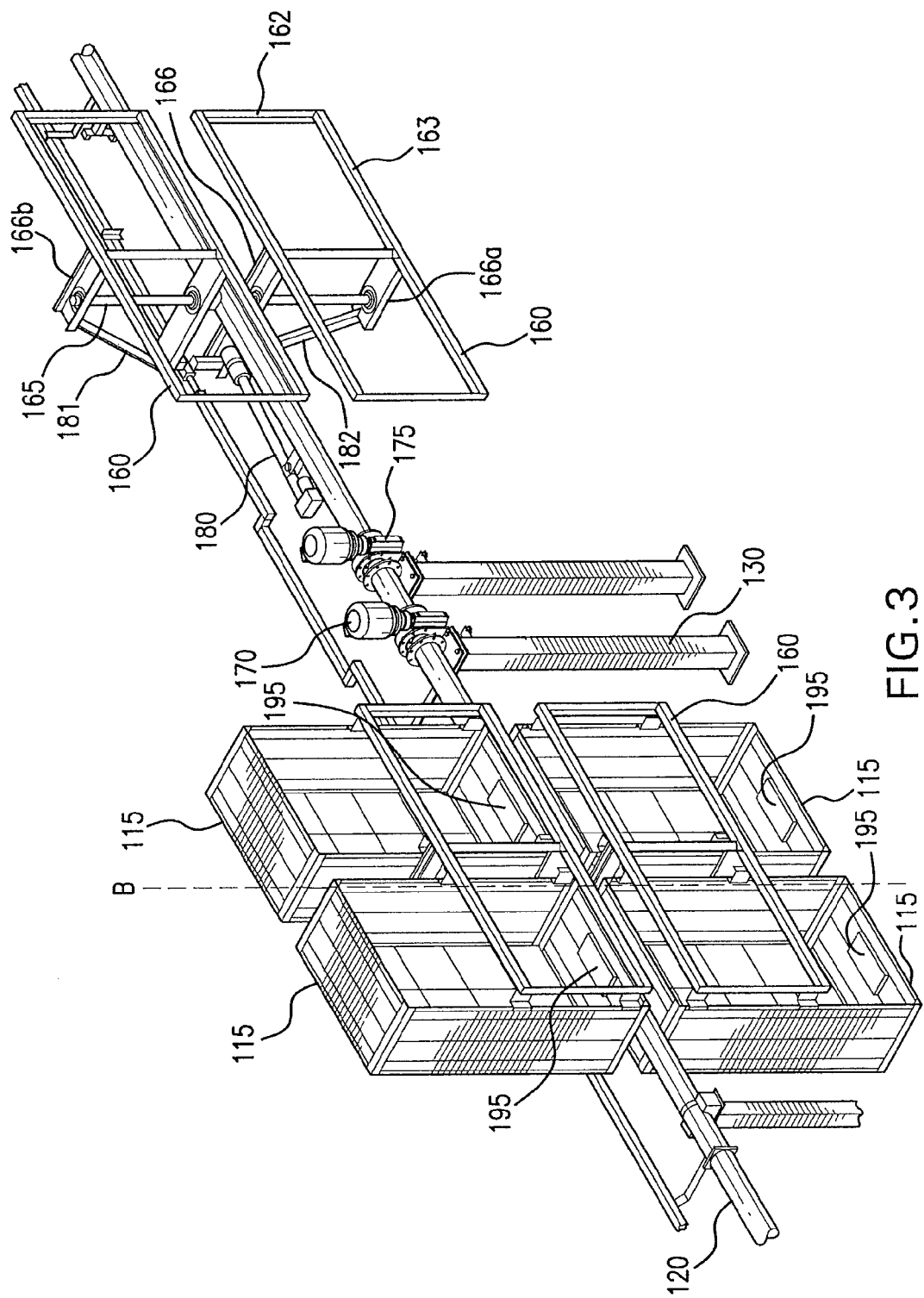
FIG. 3 is a perspective view of a mount connected to a longitudinal support according to one embodiment.

An exemplary embodiment of a terrestrial solar power system is illustrated in FIGS. 1 to 3, which illustrate a solar cell array farm 100 configured as a row of solar cell arrays each capable of tracking the sun throughout the day. Each solar cell array comprises four solar cell modules 115, with each solar cell module 115 including a generally rectangular sub-array of solar cell devices. In this embodiment, each solar cell device is a concentrating solar cell device having a rectangular concentrator lens 140 (in this embodiment a Fresnel lens) which, when properly aligned, focuses sunlight onto a solar cell receiver including a triple-junction III-V compound semiconductor solar cell.

The amount of power generated by the array is directly related to the amount of sunlight impinging upon the constituent solar cells. It is advantageous, therefore, to arrange the concentrating lenses 140 of the solar cell devices such that when the plane of the concentrator lenses 140 is orthogonal to the incoming rays of the sun, the concentrating lenses 140 direct impinging sunlight onto their corresponding solar cells so that power generation is maximized. To that end, a solar tracking mechanism is employed that ensures that the plane of concentrator lenses 140 results in a sun beam being projected on the center of the respective solar cells in a continuous manner as the sun traverses the sky during the day, thereby optimizing the amount of sunlight impinging upon the solar cells. As will be discussed in more detail hereafter, to verify correct alignment with the sun, the terrestrial solar power system is also able to perform an alignment test.

While only a single row of solar cell arrays is shown in FIG. 1, the solar tracking and alignment testing techniques discussed herein may be implemented on solar cell array farms that are formed of rows and columns of solar cell arrays, each operating independently, in full unison, or in partial unison during solar tracking.

As shown, the row of solar cell arrays is supported by an elongated frame assembly 110 configured to mount clusters of solar cell modules 115 in a longitudinally-extending and spaced-apart arrangement. Frame assembly 110 includes a longitudinal support 120 positioned above a surface 300 by spaced-apart vertical supports 130. In this embodiment, the longitudinal support 120 is a pipe with a diameter of about 4 inches and includes a thickness of about 0.167 inches. The pipe includes a length of about 192" and weighs about 110 lbs.

The longitudinal support 120 may be extended by adding one or more discrete sections 121 that are connected together in an end-to-end arrangement. The lengths and construction of each section 121 may be the same or may be different. In the embodiment illustrated in FIG. 1, the longitudinal support 120 has been extended by the addition of two sections 121, each sized to mount a single solar cell array. The modular design allows a user to construct the frame assembly 110 to a length needed to support any desired number of solar cell modules 115. That is, additional sections 121 may be added to an existing frame assembly 110 to accommodate additional solar cell arrays, as may be necessary for the row of solar cell arrays to produce the desired power output.

Referring to FIGS. 2 and 3, the solar cell modules 115 within each solar cell array are connected to the frame assembly 110 using mounts 160. The solar cell modules 115 are mounted to the mounts 160 by way of, for example, a jackscrew, threaded rod, and pivot point (e.g., a hinge) arrangement so that rotation of the jackscrew causes movement of the threaded rod resulting in rotation about the pivot point. In this way, the solar cell modules 115 may be aligned relative to the mounts 160.

The vertical supports 130 are spaced apart along the length of the longitudinal support 120. The vertical supports 130 include a length adequate to position the solar cell modules 115 above the surface 300 for rotation about the axis of the longitudinal support 120. Therefore, the vertical supports 130 are longer than a height of the mounts 160 and the solar cell modules 115.

The vertical supports 130 are positioned along the longitudinal support 120 away from the mounts 160 to prevent interference with the movement of the solar cell modules 115. As illustrated in FIG. 1, the vertical supports 130 are in a non-overlapping arrangement with the solar cell modules 115. Various numbers of vertical supports 130 may be positioned along the length of the longitudinal support 120. In the embodiment of FIG. 1, a vertical support 130 is positioned between each solar cell array. In other embodiments, the vertical supports 130 are spaced a greater distance apart along the longitudinal support 120. In one specific embodiment, the vertical supports 130 include a 4 inch by 4 inch rectangular shape, and include a thickness of about 0.188 inches. The vertical supports 130 may also be supported in a concrete pad.

Each mount 160 includes a pair of mount frames, each formed by transverse members 162 and longitudinal members 163, with each mount frame supporting a pair of solar cell modules 115. Mounts 160 may have mount frames of different sizes to accommodate different numbers of solar cell modules 115.

The mounts 160 are positioned at various spacings along the length of the longitudinal support 120. As shown in FIGS. 2 and 3, the mounts 160 are spaced along the longitudinal support 120. For each mount 160, the pair of mount frames are offset on opposing sides of the longitudinal support 120 directly across from one another, so that one pair of solar cell modules 115 are positioned on one side of the longitudinal support 120 and another pair of solar cell modules 115 are positioned on the other side of the longitudinal support 120. Such offset positioning assists to balance the solar cell array, thereby facilitating rotation about the axis of the longitudinal support 120. Other configurations are possible, including providing uneven numbers of solar cell modules 115 on opposing sides of the longitudinal support 120.

Each mount 160 has a pivot rod 165 that facilitates pivoting motion of the solar modules 115 about the axis of the pivot rod 165. In this embodiment, the pivot rod 165 extends through a base 166, on which the mount frames are mounted, from an upper base plate 166b to a lower base plate 166a. Other configurations of pivot rod are possible. Further, the pivot rod 165 may be a single elongated member or may be constructed of separate members that are positioned in an end-to-end orientation and connected to the base 166.

As shown in FIG. 2, each of the solar cell modules 115 comprises a 3×5 array of solar cell devices each having an associated concentrator lens 140. One of ordinary skill would understand that any arrangement of solar cell devices may be possible in a module, such as, for example, a 1×1, 2×2, or 5×8 array of solar cell devices. As shown in FIGS. 1-3, a solar cell array if formed by grouping solar cell modules 115 into clusters (or groups). The grouping of the modules 115 into clusters allows the roll and pitch of each cluster to be controlled separately from the other clusters. While a 2×2 cluster of four solar cell modules 115 is shown, any of a variety of arrangements are possible such as, for example, a 1×1 cluster or a 1×3 cluster. The solar cell modules 115 may also be configured as stand alone modules for which no groups are formed at all.

A roll drive means 170 is connected to the longitudinal support 120 to provide a force to rotate the longitudinal support 120 about an axis A generally aligned with the longitudinal axis of the longitudinal support 120. Such movement will hereafter be referred to as rolling the solar cell modules 115 or rotating the solar cell modules 115 in a roll direction. In this embodiment, the roll drive means 170 is positioned at one end of the longitudinal support 120. Roll drive means 170 may include a drive train with one or more gears that engage with the longitudinal support 120. Additional roll drive means 170 may be connected along the length of the longitudinal support 120 to provide additional rotational force.

A pitch drive means 175 is also connected to the longitudinal support 120 to rotate each cluster of solar cell modules 115 along a respective axis B which is substantially perpendicular to axis A. In particular, the axis B is generally aligned with the pivot rod 165 for the cluster of solar cell modules 115. Such movement will hereafter be referred to as pitching the solar cell modules 115 or rotating the solar cell modules 115 in a pitch direction.

As shown in FIGS. 2 and 3, in this embodiment the pitch drive means 175 is connected, via a connector 180, to a mount 160 having first and second arms 181, 182, connected together at a neck 183, on opposing sides of the base 166. The pitch drive means 175 provides a force to rotate that mount 160 about axis B, and connections are provided between that mount 160 and the other mounts 160 so that a corresponding rotation occurs for the other mounts 160. The pitch drive means 175 may include a drive train with one or more gears that engage with the mount 160. In an alternative embodiment, the pitch drive means 175 and the roll drive means 170 may share a common actuator to provide rotational force selectively around the first axis A and the second axis B.

Each solar cell module 115 is moved into position to track the sun by rotating the module 115 about the first axis A and the second axis B using the roll drive means 170 and the pitch drive means 175. A controller 190 controls the movement of the terrestrial solar tracking array 100. The controller 190 includes a microcontroller with associated memory. In one embodiment, the controller 190 includes a microprocessor, random access memory, read only memory, and an input/output interface. The controller 190 controls operation of one or more roll motors 311 which form part of the roll drive means 170 and rotate the longitudinal support 120 and the solar cell modules 115 about the first axis A. The controller 190 also controls the one or more pitch motors 310 which form part of the pitch drive means 175 to rotate the clusters of solar cell modules 115 about their respective second axes B. The controller 190 includes an internal timing mechanism such that the operation of the motors corresponds to the time of day enabling the solar cell modules 115 to track the azimuth and elevation of the sun.

Each solar cell module 115 includes a printed circuit board (PCB) 195 connected to controller 190. The PCBs 195 send information such as measured power output from each solar cell receiver in the solar cell module 115. In another example, each PCB 195 sends the collective measured power for the entire solar cell module 115 to the controller 190. In another example, a PCB may be assigned to each solar cell cluster (i.e., the 2×2 cluster of four solar cell modules 115 between supports 130 in the illustrated example) and send the collective measured power output from the solar cell array to the controller 190. The transmitted data may be encoded to identify which receiver, module, and/or solar cell array the measured power data has originated from. If additional sensors (e.g., alignment triggering sensors) are provided, then the PCBs 195 may transmit sensed data as well. The PCBs 195 may also be used to receive information from the controller 190 based on the time of day for the solar cell modules 115.

Figure 4:
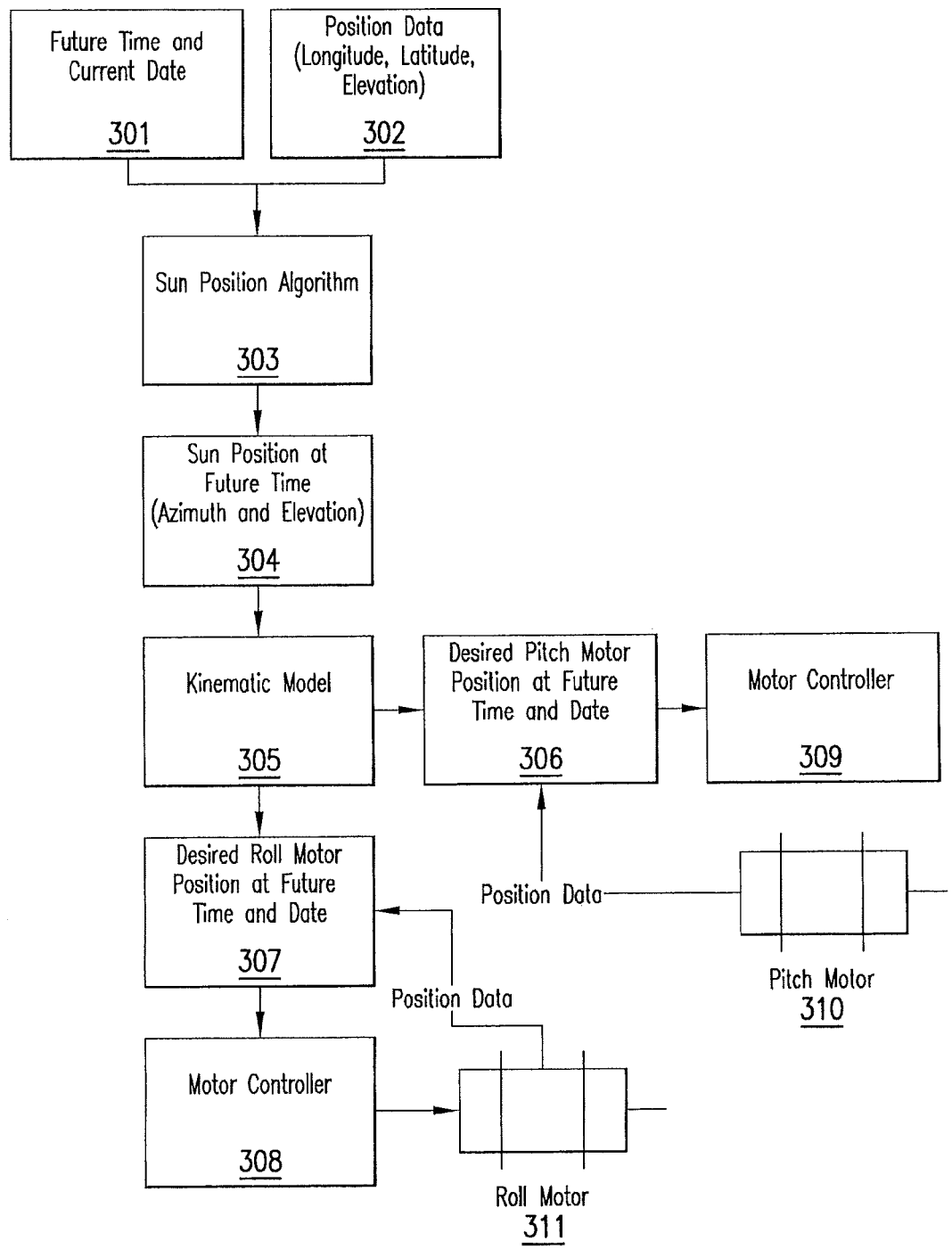
FIG. 4 is a block diagram of an implementation of a terrestrial solar tracking system.

FIG. 4 is a block diagram schematically showing the basic functioning of a terrestrial solar tracking system used in this embodiment. The system receives as input data (a) the date and a future time data 301 and (b) position data 302, including, e.g., longitude, latitude and elevation above sea level. In this implementation, the system utilizes future time data 301 rather than the current time data so that rather than lagging behind the sun, the array can be oriented to align with the sun at its expected position at the future time.

At the start of the day, the future time specified in the future time data 301 can be a start up future time when the solar cell modules 115 are first oriented toward the sun for tracking during the daytime. In some implementations, the start-up future time can be sunrise, so that upon sunrise, the solar cell module 115 is aligned with the sun at sunrise. In other implementations, the start up future time is at some predetermined time after sunrise. Using a start up time after sunrise allows the solar cell modules 115 to start tracking the sun from a tilted start up position, instead of from a fully (or nearly) vertical position facing the sunrise on the horizon. In some examples, the start up position corresponding to this start up time may be the same as the "parked" (or storage) position of the solar cell modules during a night mode. For example, the start up position may be a predetermined angular position of 15 degrees, instead of 0 degrees. Following the start up time, to maintain alignment the system can repeat its alignment calculation periodically (e.g., every minute) or continuously, each calculation using an appropriate future time.

Based on at least the input data 301, 302, a sun position predictor in the form of a sun position algorithm 303 calculates the position of the sun (e.g., its azimuth and elevation) relative to the solar cell array at that future time 304. In some implementations, the sun position algorithm 303 includes the Solar Position Algorithm (SPA) available from the National Renewable Energy Laboratory (see http://rredc.nrel.gov/solar/codesandalgorithms/spa/ and http://www.nrel.gov/docs/fy08osti/34302.pdf, both of which are incorporated herein by reference).

The sun's azimuth and elevation at the future time 304 as output by the sun position algorithm 303 are input data to a kinematic model 305, which correlates the sun's azimuth and elevation with respective positions of the pitch motor 310 and the roll motor 311 to align the solar cell modules 115 with the impinging sunlight. As such, the kinematic model 305 outputs appropriate pitch motor position data to a pitch motion calculator 306 which generates and sends an appropriate control signal to the motor controller 309 for the pitch motor 310, and outputs appropriate roll position data 307 to a roll motion calculator 307 which generates and sends an appropriate control signal to a motor controller 308 for the roll motor 311, so that the solar cell modules 115 are aligned with the sun's elevation and azimuth at the future time 304. Each of the motors 310, 311 includes a position encoder that determines the current position of each respective motor (e.g., measured by the rotational position of the drive shaft, represented as an integral number of "counts" or increments of a predetermined numbers of degrees, starting from zero and continuing through 360 degrees for one turn, 720 degrees for two turns, etc.). For control purposes, the position data is fed back to the respective motor position calculator 306, 307. The position encoder may determine position based on a baseline position corresponding to a start up position of the solar cell modules 115. As described, this start up position for solar tracking may be one in which the solar cell modules 115 start tracking the sun at sunrise. However, in other implementations, this start up position corresponds to a position at a future time after sunrise, at which the solar cell modules 115 are to start tracking the sun.

Motor controllers 308, 309 allow the low-power logic signals based on the algorithms to control the relatively high-power circuits of the motors 310, 311.

The data and algorithms of blocks 301-307 can be stored in one or more data stores (e.g., magnetic media, solid state media, or other suitable memory structure). The processing of, e.g., blocks 303 and 305-307 can be performed by, e.g., one or more microprocessors or special or general purpose computers.

Figure 5:
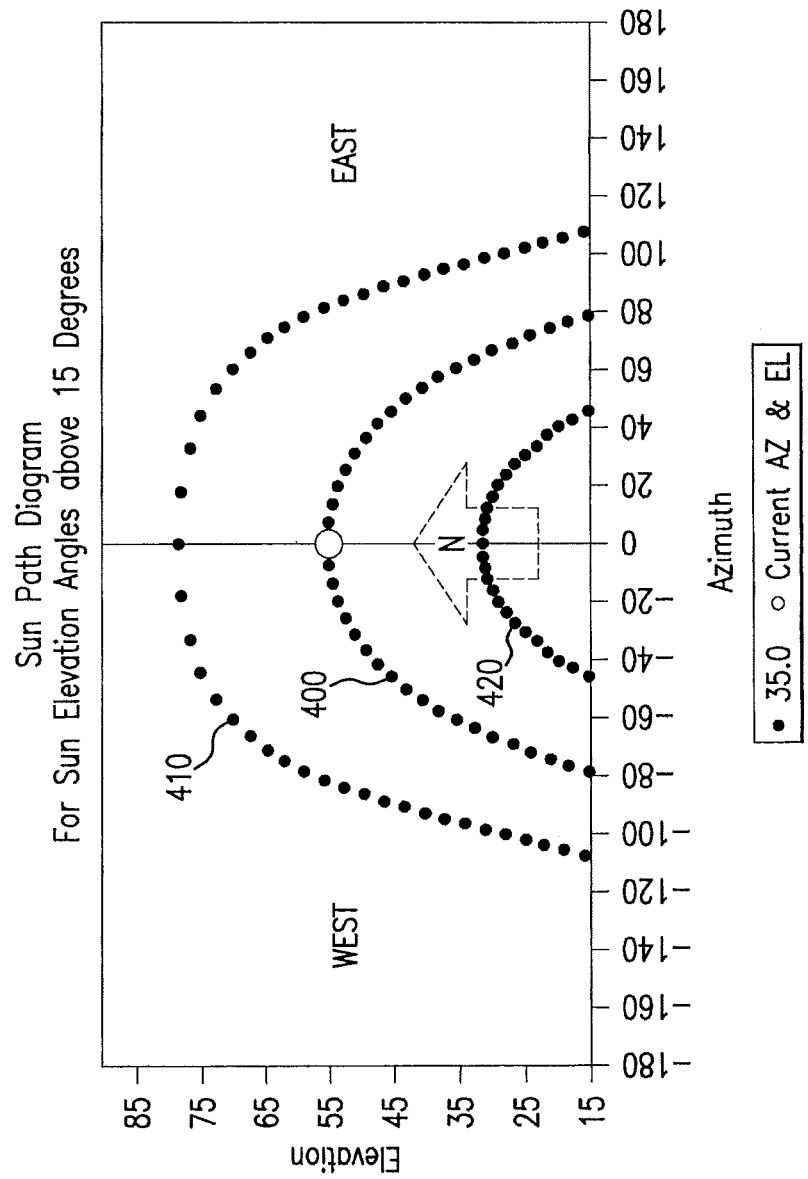
FIG. 5 is a plot of actual azimuth and elevation values for the sun, for sun elevation angles over 15 degrees, during three exemplary days.

FIG. 5 is a plot of actual azimuth and elevation values for the sun, for sun elevation angles above 15 degrees. Plot 400 shows one actual path of the sun in both azimuth and elevation during an example day. Plots 410 and 420 each show a plot during two other days. As can be seen, plot 410 generally shows an azimuth and elevation of the sun much higher than plot 400, the "current" azimuth and elevation, while plot 420 generally shows an azimuth and elevation much lower than plot 400. Thus, it may be concluded that plots 410 and 420 occur during different seasons. For example, Plot 410 may occur closer to the summer months while plot 420 may occur closer to the winter months.

Figure 6:
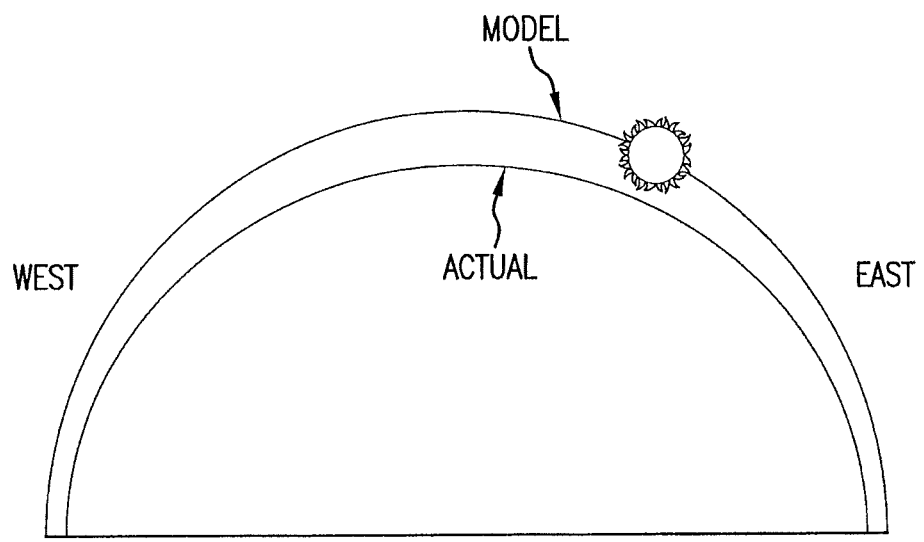
FIG. 6 illustrates the actual path of the sun in comparison with an actual alignment direction resulting from a misaligned solar tracking.

While a solar tracking algorithm predicts or models the position of the sun throughout a typical year, misalignments between the position of the sun and the alignment of a solar cell array may occur for various reasons. For example, there may be errors in the sun position algorithm or the kinematic model. Even if the sun position algorithm and kinematic model are correct at one time instance, movements of the solar cell arrays either on a slow timescale (e.g. a gradual sagging of the longitudinal support 120 or subsidence of the whole row of solar cell arrays) or a fast timescale (for example earthquake movement) can lead to misalignment occurring. FIG. 6 illustrates the actual path of the sun in comparison to the actual alignment of a solar cell array having misaligned solar tracking.

To stay properly aligned with the sun during solar tracking, in this embodiment the terrestrial solar tracking system performs an alignment testing routine to correct misalignment relative to the sun. The alignment testing routine may be initiated manually by a user operation or automatically by the controller 190 based on a triggering event, which may be a sensed event or a predetermined time. As discussed hereafter, the alignment testing routine moves the solar cell modules off a current position in the roll and/or pitch directions while measuring (e.g., "scoring") the performance of a cluster of four solar cell modules 115, and analyses the measured performance data.

Figure 7:
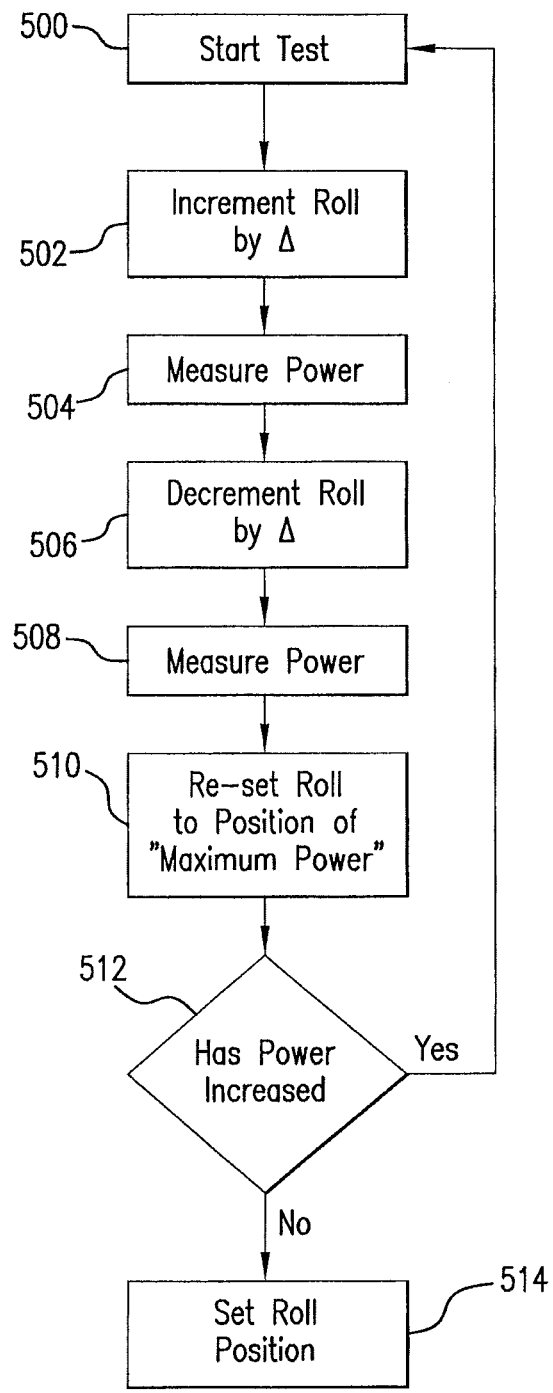
FIG. 7 is a flow diagram of a process for monitoring an output parameter of a solar cell array or group of solar cell arrays for determining an optimized roll position.
Figure 8:
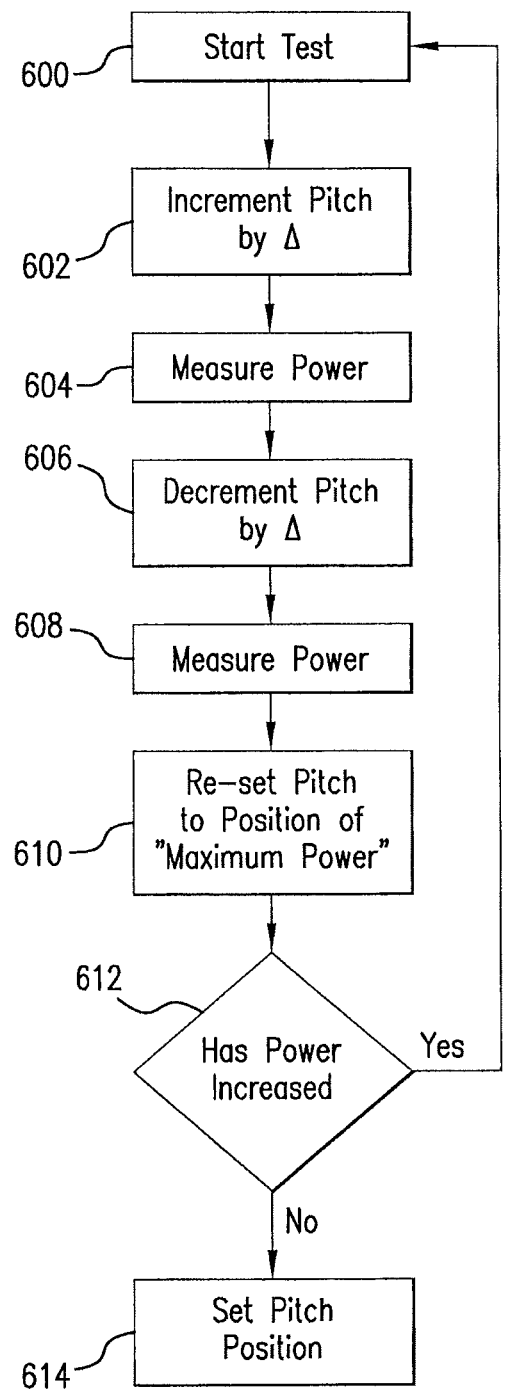
FIG. 8 is a flow diagram of a process for monitoring an output parameter of a solar cell array or group of solar cell arrays for determining an optimized pitch position.

In this embodiment, the alignment testing routine separately increments the roll position and the pitch position for a solar cell array and monitors the output current and/or power of the solar cell array. (For simplicity, we may also use the term "power" herein although either the parameter current or power may actually be measured). FIG. 7 illustrates the process steps for monitoring the power of a solar cell array using an increment delta adjustment on the roll. Similarly, FIG. 8 illustrates the process steps for monitoring the power of a solar cell array using an increment delta adjustment on the pitch. Both FIGS. 7 and 8 illustrate techniques that individually or in combination may be used to correct for misalignment in solar tracking, as well as any of the other uses for monitored data as discussed herein.

As shown in FIG. 7, a performance-monitoring test is started at block 500 with the solar array in a set position determined by the solar tracking system. The roll position of the solar cell array is adjusted to a position an increment amount, delta, from the set position at block 502. The current output of the cluster of solar cell modules 115 at the new incremented position is then measured at block 504. Then the roll position is then adjusted to a position decremented from the set position by an amount delta at block 506. The current output of the cluster of solar cell modules 115 at the decremented position is then measured at block 508. Based on the measured current or power from the incremented and decremented positions and the power at the original set position, a re-evaluation of the position of maximum power for the roll is performed at block 510 and the roll position is set to the position of "maximum power." In particular, in this embodiment the re-evaluation of the maximum power position involves performing a weighted averaging of the incremented and decremented roll positions using the corresponding measured power outputs as weighting factors for the incremented and decremented roll positions. The power of the original set position may be sampled during block 510 or alternatively, data measured prior to starting the test at block 500 may be used as a power measurement for the original set position.

If it is determined that the power has increased in the re-evaluated maximum power position compared with the original set position, then the alignment testing routine is repeated again using the re-evaluated maximum power position as the set position until the measured power is no longer increasing. If the measured power is no longer increasing, then at block 514 the system sets the cluster of solar cell modules 115 to the determined roll position.

Similarly, FIG. 8 illustrates a corresponding set of process steps for the pitch position. In the process implemented in FIG. 8, a performance-monitoring test for the pitch position is started at block 600. The pitch position of the solar cell array is adjusted to a position an increment amount, delta, from an original set position at block 602. The power output of the cluster of solar cell modules 115 at the new incremented position is then measured at block 604. Then the pitch position is adjusted to a position decremented by an amount delta from the original set position at block 606, and the power output of the cluster of solar cell modules 115 at the decremented position is measured at block 608. Based on the measured power from the incremented and decremented positions, a re-evaluation of the position of maximum power for the pitch position is performed at block 610 using a weighted averaging as described with reference to FIG. 7. If the power output has increased from that in the original set position at block 612, then the alignment testing routine is repeated again using the re-evaluated pitch position as the original set position for further increments and decrements until the measured power is no longer increasing. If the measured power is no longer increasing, then at block 614 the system sets the cluster of solar cell modules 115 to the determined pitch position.

The adjustment of the roll and pitch positions performed in FIGS. 7 and 8 above is complicated in this embodiment by the fact that the solar cell arrays are unbalanced and the positional feedback data provided from the position encoder in the roll and pitch motors exhibits some hysteresis (in other words, the previous movement history will affect the relationship between the positional feedback data and the actual position). To address this problem, in this embodiment during the alignment testing routine when the process of FIG. 7 is performed the roll position is first moved to a reference roll position to one side of the set position and then the roll position is varied in a single direction to the incremented position and subsequently to the decremented position. The roll position is then returned to the reference roll position, and then the roll position is moved to the position of maximum power. The process of FIG. 8 is performed in an analogous manner. The reference roll position and the reference pitch position may correspond to a parked position for the solar cell array. In this way, by always moving in the same direction from a reference position more accurate positioning is achieved.

The monitored output parameter data from the cluster of solar cell modules 115 may be used purely for data logging to facilitate future manual adjustment of the solar tracking system. Further, the monitored data may be collected, based on periodic measurements, and compared against historical monitored data to identify trends in the monitored data, such as increasingly, progressive failure of the terrestrial solar tracking system. In such examples, the regression analysis or other means may be used to determine if the monitored data reaches a threshold level warranting action, and in response to reaching the threshold level notification indicating action is required is generated and output.

Figure 9:
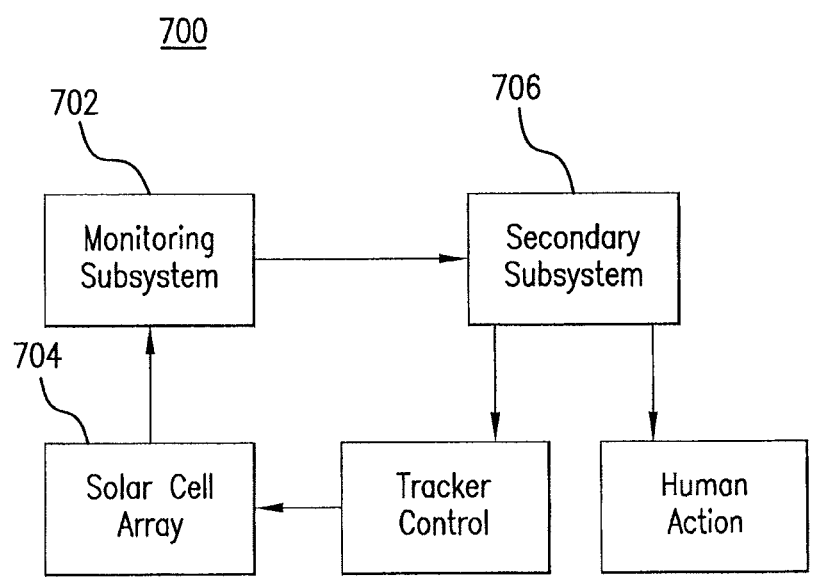
FIG. 9 illustrates a system for monitoring performance of a solar cell array.

FIG. 9 provides a schematic illustration of a system 700 in which a first subsystem 702, such as the alignment testing routine described above, monitors performance of a solar cell array 704. The monitoring system 702 may be triggered manually or automatically based on discrete events or periodic measurements. The triggering may be based on actual measured event, heuristic assumptions of conditions pertinent to operation, or other triggers. The triggering events may change over time or in response to the type of monitoring. For example, if the monitoring system 702 is to monitor for a first type of performance metric, then one triggering scheme may be used, while a different triggering scheme may be used for a different type of performance metric.

The monitored data from the system 702 is provided to a second subsystem 706 which takes the monitored data, analyzes the data, and then provides an output which preferably performs some modification, transformation, or actuation, etc. based on that analysis. The second subsystem 706 may contain a processor for data analysis and a memory storage means for storing physical data corresponding to solar cell array 704. In other examples, the subsystem 706 may be a motor control subsystem for the solar cell array 704, a motor control subsystem for an entirely different solar cell array, or some other type of actuation based system.

As discussed above, the second subsystem 706 may compare the measured performance with a threshold value, and output a warning to an operator if the measured performance crosses the threshold value. Alternatively, the subsystem 706 may be a processor-based system executing instructions to take monitored data and automatically adjust the kinematic model for the solar tracking system or the sun position algorithm.

In other embodiments, the subsystem 706 could be a separate system that is interdependent upon the performance of the solar cell array 704. For example, the subsystem 706 could be a system (e.g., a facility, dwelling, group of buildings, device, assembly or the like) that has a power demand dependent upon the solar cell array 704. The subsystem 706, therefore, may output a power usage regulation control for that system, whereby the subsystem 706 adjusts power usage in response to monitored performance data.

In this embodiment, the monitored data corresponds to the power output of a solar cell array formed by a cluster of solar cell modules 115. Alternatively, the monitored data can be collected on a per solar cell module basis to monitor performance of each solar cell module 115. In this way, a misalignment between solar cell modules, or clusters of solar cell modules may be detected and an output signal generated indicating the misalignment. Further, the failure of a solar cell module 115 may be detected and an output signal generated indicating that failure.

In other embodiments, however, the monitored data can be aggregated data from the terrestrial solar power system. Such monitoring allows a system to monitor and control a series of arrays together for performance optimization.

In the illustrated embodiment, monitored data from one solar cell array is used to adjust the tracking for all solar cell arrays. This allows one or a smaller number of solar cell modules 115 to be individually mechanically adjusted, if need be, through the delta ranges on pitch, with respect to the position of other solar cell modules in the array. i This could also be useful in that at a given time certain solar cell modules 115 may be in direct view of the sun and thus more useful in monitoring performance than solar cell modules under cover of cloud and blocked from direct sunlight.

The output parameter can be the normal output parameter measured for the solar cell module 115, for example, the output current or the output power. Typically, during illumination the arrays constantly produce current, and therefore it is straightforward to provide electrical taps at the module level, the cluster level, or the array level, to capture and measure the produced current associated with any one module, cluster or array, and transmit such parameters to a system monitor for real time performance monitoring and analysis, or to data storage, so that the data can be accessed at a future time for analysis. The frequency with which the data is analyzed for alignment can vary, and can be at automatic intervals or up from automatic or manual triggering events. The techniques may be executed automatically each day, each week, each month, or seasonally. Of course, these are by way of example, as the techniques may be executed more frequently as well, for example.

The system may consider numerous factors for measuring output parameter data. In fact, such factors can be used to determine when to initiate the alignment testing routine altogether, i.e., whether the output parameter data should be analyzed in the first instance. Other factors may be used to determine whether to execute alignment adjustment of the solar cell array based on the measured output parameters. For example, a decisional model may be used that analyzes power measured by the solar cell array and considers whether there has been a sudden drop in power that suggests an re-alignment is needed (such as a wind storm or ground shift) or a sudden drop that does not (such as a cloud moving between the sun and array). Other factors may include the average power measured over the day while solar tracking, historical data from previous, similar tracking periods (e.g., the day before, a similar day the year before, etc.). In any event, the decisional model may consider all such relevant factors in determining whether to actually analyze the measured parameter and determine whether a measured value suggests that alignment is needed or not.

The algorithms of FIGS. 7 and 8 are example applications of the monitored data measured by the system. These algorithms can be initiated manually by operator initiation or automatically, such as at predetermined intervals or at specifically determined events such as at start up. Other triggering events include a sudden decrease in a measured output parameter, which may indicate that the solar tracking routine is not aligned, or more slowly varying errors such as currently measured output parameters that are smaller in value than previous measurements from the same measurement period.

In an alternative embodiment, instead of measuring the power at incremented and decremented positions relative to the set position, the alignment testing routine may monitor the power and measure the positions on either side of the set position at which a certain percentage drop in power has occurred for both the roll position and the pitch position. The maximum power position may then be determined by calculating the midpoint between the two measure positions. Again, the process is repeated in an iterative manner if the power at the maximum power position is greater than the power at the set position.

The delta values discussed in FIGS. 7 and 8 may or may not be fixed. The same adjustment values may be made for pitch and roll in some examples. But in others the adjustment values will be different. These values may be static, that is a fixed angle. In other examples, the amount of adjustment may be determined by the actual monitored output parameter. Typically, the delta values will be less than 5°.

The performance monitoring and alignment algorithm of FIGS. 7 and 8 may be performed as an auxiliary operation of a solar tracking mechanism that optimally predicts the location of the sun at a future time, and orients the array such that it aligns with the sun at that future time. The algorithm therefore is able to add further optimization to such a routine.

In addition to triggering based on sudden decreases, the algorithms may be triggered by accumulated decreases over time, such as a continuous unexplained decrease in output power.

While in the embodiments discussed above, the power performance of the solar cell array is monitored, in alternative embodiments the position of the solar cells could be directly monitored. Separate sensors could be used to measure the position of the longitudinal or vertical supports, for example, to measure against beam twisting or sagging. In response to a threshold value being reached, a warning signal could be output to an operator. Other examples are described herein and yet others will now become apparent to persons of ordinary skill in the art.

The above embodiments have been described in the context of a terrestrial solar power system in which a plurality of solar cell arrays are mounted in a spaced configuration along a longitudinal support for rotation in tandem about an axis A generally aligned with the longitudinal support, and with each array also being rotatable about a respective axis B generally orthogonal to the longitudinal support. A skilled person will recognize that the monitoring techniques described above can be used with other configurations of solar power system. For example, the monitoring techniques could be used with a terrestrial solar tracking system having an array of solar cell modules mounted on a single tower, with the array of solar cell modules being adjustable in the azimuth direction and the elevation direction in order to track the sun.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

A number of implementations have been described. Nevertheless, it will be understood that various modifications may be made without departing from the spirit and scope of the invention. Accordingly, other embodiments are within the scope of the claims.

What is claimed is:

1. A solar cell system above a surface comprising:
   at least one photovoltaic solar cell array, wherein each of the at least one photovoltaic solar cell array comprises:
      a plurality of clusters of solar cell modules, wherein each of the plurality of clusters comprises a plurality of solar cell modules connected to each other such that the plurality of solar cell modules move together about a pitch axis and about a roll axis, wherein the roll axis is parallel the surface and perpendicular the pitch axis, wherein each of the plurality of clusters of solar cell modules is configured to rotate about the roll axis, wherein the pitch axis of each of the plurality of clusters of solar modules rotates about the roll axis when the cluster rotates about the roll axis, wherein each of the solar cell modules comprises a plurality of solar cell devices, wherein each of the solar cell devices comprises:
         semiconductor solar cell configured to convert sunlight into electrical energy, and
         a concentrator lens configured to focus sunlight onto the semiconductor solar cell, and
      roll and pitch apparatus configured to control the roll and pitch of each of the plurality of clusters;
   at least one controller operably coupled to the at least one photovoltaic solar cell array and configured to predict a position of the sun during the course of a day and to determine respective actuations for the roll and pitch apparatus corresponding to the plurality of clusters of solar cell modules of the at least one photovoltaic solar cell array being substantially aligned with the sun during the course of the day;
   at least one longitudinal support for each of the at least one photovoltaic solar cell array configured to mount the plurality of clusters of solar cell modules in a longitudinally-extending and spaced-apart arrangement;
   at least one vertical support positioned along the at least one longitudinal support; and
   a mount for each of the plurality of clusters of solar cell modules coupled between each of the solar cell modules and to the at least one longitudinal support.

2. The solar cell system of claim 1, wherein the roll and pitch apparatus comprises a pitch drive apparatus configured to rotate at least one of the plurality of clusters of solar cell modules about the pitch axis.

3. The solar cell system of claim 1, wherein two or more of the plurality of clusters of solar cell modules are operatively connected together to move about their pitch axes together.

4. The solar cell system of claim 1, wherein the roll axis of each of the plurality of clusters of solar cell modules is the same axis, wherein the roll and pitch apparatus comprises at least one roll drive apparatus configured to rotate two or more of the plurality of clusters of solar cell modules about the roll axis.

5. The solar cell system of claim 1, wherein the at least one controller is further configured to output a plurality of sampled values of an output parameter to a remote system.

6. The solar cell system of claim 1, wherein the at least one controller is further configured to output a control signal to a remote system in response to analysis of a plurality of sampled values of an output parameter.

7. The solar cell system of claim 1, wherein the roll and pitch apparatus further comprises position encoders configured to determine the roll and pitch of each of the plurality of clusters of solar cell modules.

8. A solar cell system comprising:
at least one photovoltaic solar cell array, wherein each of the at leas one photovoltaic solar cell array comprises:
a plurality of clusters of solar cell modules arranged along a roll axis, wherein each of the plurality of clusters comprises a plurality of solar cell modules connected to each other such that the plurality of solar cell modules move together about the roll axis and about a pitch axis perpendicular to the roll axis, wherein the pitch axis of each of the plurality of clusters of solar cell modules rotates about the roll axis when the cluster rotates about the roll axis, wherein each of the solar cell modules comprises a plurality of solar cell devices, wherein each of the solar cell devices comprises:
semiconductor solar cell configured to convert sunlight into electrical energy, and
a concentrator lens configured to focus sunlight onto the semiconductor solar cell,
at least one pitch drive apparatus configured to rotate at least one of the plurality of clusters of solar cell modules about its pitch axis;
at least one roll drive apparatus coupled to the plurality of clusters of solar cell modules and configured to rotate two or more of the plurality of clusters of solar cell modules about the roll axis;
at least one longitudinal support for each of the at least one photovoltaic solar cell array configured to mount the plurality of clusters of solar cell modules in a longitudinally-extending and spaced-apart arrangement;
at least one vertical support positioned along the at least one longitudinal support; and
a mount for each of the plurality of clusters of solar cell modules coupled between each of the solar cell modules and to the at least one longitudinal support.

9. The solar cell system of claim 8, wherein two or more of the plurality of clusters of solar cell modules are operatively connected together to move about their pitch axes together.

10. The solar cell system of claim 8, wherein the system further comprises a controller operatively coupled to the at least one pitch drive apparatus of the at least one photovoltaic solar cell array and to the at least one roll drive apparatus and configured to control the roll and pitch of each of the plurality of clusters of the at least one photovoltaic solar cell array using the at least one pitch drive apparatus and the at least one roll drive apparatus.

11. A solar cell system comprising:
at least one photovoltaic solar cell array, wherein each of the at least one photovoltaic solar cell array comprises:
a plurality of clusters of solar cell modules, wherein each of the plurality of clusters comprises a plurality of solar cell modules connected to each other such that the plurality of solar cell modules move together about a pitch axis and about a roll axis perpendicular to the pitch axis, wherein each of the solar cell modules comprises a plurality of solar cell devices, wherein each of the solar cell devices comprises:
semiconductor solar cell configured to convert sunlight into electrical energy, and
a concentrator lens configured to focus sunlight onto the semiconductor solar cell;
a longitudinal support extending along a roll axis and coupled to the plurality of clusters of solar cell modules in a longitudinally-extending and spaced-apart arrangement;
at least one vertical support positioned along the at least one longitudinal support to support the longitudinal support and plurality of clusters of solar cell modules above a surface;
at least one roll drive apparatus coupled to the longitudinal support and configured to rotate two or more of the plurality of clusters of solar cell modules about the roll axis, wherein the pitch axis of each of the plurality of clusters of solar cell modules rotates about the roll axis when the cluster rotates about the roll axis; and
a mount for each of the plurality of clusters of solar cell modules coupled between each of the solar cell modules and to the at least one longitudinal support.

12. The solar cell system of claim 11, wherein each of the at least one photovoltaic solar cell array comprises at least one pitch drive apparatus configured to rotate at least one of the plurality of clusters of solar cell modules about the pitch axis.

13. The solar cell system of claim 11, wherein two or more of the plurality of clusters of solar cell modules are operatively connected together to move about their pitch axes together.

14. The solar cell system of claim 11, wherein the system further comprises at least one controller operably coupled to the at least one photovoltaic solar cell array and configured to output a plurality of sampled values of an output parameter to a remote system.

15. The solar cell system of claim 11, wherein the system further comprises at least one controller operably coupled to the at least one photovoltaic solar cell array and configured to output a control signal to a remote system in response to analysis of a plurality of sampled values of an output parameter.

* * * * *

UNITED STATES PATENT AND TRADEMARK OFFICE
CERTIFICATE OF CORRECTION

PATENT NO. : 8,890,044 B2
APPLICATION NO. : 13/946793
DATED : November 18, 2014
INVENTOR(S) : James Sherman et al.

It is certified that error appears in the above-identified patent and that said Letters Patent is hereby corrected as shown below:

In the Claims

In column 12, claim 1, line 19, please insert --cell-- after "clusters of solar".

In column 13, claim 8, line 7, please delete "leas" and insert --least--.

Signed and Sealed this
Twelfth Day of May, 2015

Michelle K. Lee
*Director of the United States Patent and Trademark Office*